US008299372B2

(12) United States Patent
Swais et al.

(10) Patent No.: US 8,299,372 B2
(45) Date of Patent: Oct. 30, 2012

(54) ANTENNA UNIVERSAL MOUNT JOINT CONNECTORS

(75) Inventors: Imad M. Swais, Bloomingdale, IL (US); Rafael Haro, Chicago, IL (US); Robert K. Antonio, Lake Zurich, IL (US)

(73) Assignee: Laird Technologies, Inc., Chesterfield, MO (US)

( * ) Notice: Subject to any disclaimer, the term of this patent is extended or adjusted under 35 U.S.C. 154(b) by 410 days.

(21) Appl. No.: 12/814,082

(22) Filed: Jun. 11, 2010

(65) Prior Publication Data

US 2011/0303455 A1 Dec. 15, 2011

(51) Int. Cl.
*H05K 9/00* (2006.01)

(52) U.S. Cl. .......... 174/377; 343/872; 343/878; 29/600; 439/578

(58) Field of Classification Search .................. 174/377; 361/816; 343/872, 878; 29/600; 439/578
See application file for complete search history.

(56) References Cited

U.S. PATENT DOCUMENTS 2,234,737 A 3/1941 Mace
2,299,785 A 10/1942 Barrett
2,449,562 A 9/1948 Meier
2,473,141 A 6/1949 Friedberg
2,505,424 A 4/1950 Moseley
2,748,905 A 6/1956 Avruch
2,931,897 A 4/1960 Tuve
3,138,661 A 6/1964 Grashow
3,666,902 A 5/1972 Owen et al.
3,898,666 A 8/1975 Massa
4,021,809 A 5/1977 Klancnik
4,047,779 A 9/1977 Klancnik
4,173,761 A 11/1979 Liautaud
4,179,698 A 12/1979 Liautaud
4,198,638 A 4/1980 Carolus
4,210,914 A 7/1980 Blackman
4,243,989 A 1/1981 Piper
4,282,526 A 8/1981 Alf et al.
4,851,609 A * 7/1989 Reddy ........................... 174/371
4,867,698 A 9/1989 Griffiths
5,015,194 A 5/1991 Seas
5,166,695 A 11/1992 Chan et al.
5,184,142 A 2/1993 Hornburg et al.
5,389,942 A * 2/1995 Oglesby, Jr. .................. 343/872
6,023,245 A 2/2000 Gomez et al.

(Continued)

FOREIGN PATENT DOCUMENTS

GB 2192757 1/1988

(Continued)

*Primary Examiner* — Hung Ngo

(74) *Attorney, Agent, or Firm* — Harness, Dickey & Pierce, P.L.C.

(57) ABSTRACT

An antenna mount assembly is disclosed. The antenna mount assembly includes an output contact and an antenna mount body. The antenna mount body includes an output portion, a shielding compartment for housing and electromagnetically shielding a connection between a coaxial cable and the output contact, and an access port to permit access to the shielding compartment around the connection between the coaxial cable and the output contact. An antenna mount nut is mechanically attachable to the output portion of the antenna mount body. The antenna mount nut is configured for mechanically attaching an antenna to the antenna mount body. The output contact is coupled to the antenna mount body. The output contact extends from the output portion and into the shielding compartment for electrically connecting the coaxial cable to the output portion. Antenna mount bodies, connector assemblies and methods of making and installing antenna mounts, and connectors are also disclosed.

29 Claims, 14 Drawing Sheets

U.S. PATENT DOCUMENTS

| | | | | |
|---|---|---|---|---|
| 6,236,377 | B1 | 5/2001 | Hussaini et al. | |
| 6,384,793 | B2 | 5/2002 | Scordilis | |
| 6,469,678 | B1 | 10/2002 | Pullen | |
| 6,473,043 | B1 * | 10/2002 | Hwang | 343/702 |
| 6,518,932 | B1 | 2/2003 | Matsui et al. | |
| 6,522,291 | B1 | 2/2003 | Noguchi et al. | |
| 6,657,589 | B2 | 12/2003 | Wang et al. | |
| 6,762,727 | B2 | 7/2004 | Rochford et al. | |
| 6,867,746 | B2 | 3/2005 | Mendolia et al. | |
| 7,002,523 | B2 | 2/2006 | Noro et al. | |
| 7,004,666 | B2 | 2/2006 | Kozlovski | |
| 7,091,912 | B2 | 8/2006 | Iacovella et al. | |
| 7,091,915 | B1 | 8/2006 | Truthan et al. | |
| 7,176,839 | B2 | 2/2007 | Ueda et al. | |
| 7,268,734 | B2 | 9/2007 | Cislo | |
| 7,768,465 | B2 * | 8/2010 | Jared et al. | 343/713 |
| 7,830,314 | B2 * | 11/2010 | McGuire et al. | 343/702 |
| 8,059,044 | B2 * | 11/2011 | Rode et al. | 343/713 |
| 2004/0174311 | A1 | 9/2004 | Kordass et al. | |
| 2004/0183734 | A1 | 9/2004 | Noro et al. | |
| 2005/0184923 | A1 * | 8/2005 | Saito et al. | 343/878 |
| 2006/0103579 | A1 | 5/2006 | Blickle | |
| 2008/0266198 | A1 * | 10/2008 | Walker et al. | 343/846 |
| 2008/0278399 | A1 * | 11/2008 | Nakajima et al. | 343/872 |
| 2011/0291913 | A1 * | 12/2011 | Lai et al. | 343/878 |

FOREIGN PATENT DOCUMENTS

| | | |
|---|---|---|
| WO | WO 2008/111816 | 9/2008 |
| WO | WO 2009/029520 | 3/2009 |

* cited by examiner

ANTENNA UNIVERSAL MOUNT JOINT CONNECTORS

FIELD

The present disclosure relates generally to mounting and connecting antennas to transmission lines for interconnecting an antenna to a device for the purpose of transmitting and/or receiving radio frequency signals.

BACKGROUND

This section provides background information related to the present disclosure which is not necessarily prior art.

Antennas are commonly connected to coaxial cables, which in turn, are connected to radio devices. In this exemplary manner, an antenna may thus be interconnected to a radio device for the purpose of transmitting and/or receiving radio frequency signals.

SUMMARY

This section provides a general summary of the disclosure, and is not a comprehensive disclosure of its full scope or all of its features.

Antenna mounts are disclosed, which may be used for mounting and connecting an antenna to a transmission line. In exemplary embodiments, an antenna mount assembly generally includes an output contact and an antenna mount body. The antenna mount body includes an output portion, a shielding compartment for housing and electromagnetically shielding a connection between a coaxial cable and the output contact, and an access port to permit access to the shielding compartment around the connection between the coaxial cable and the output contact. An antenna mount nut is mechanically attachable to the output portion of the antenna mount body. The antenna mount nut is configured for mechanically attaching an antenna to the antenna mount body. The output contact is coupled to the antenna mount body. The output contact extends from the output portion and into the shielding compartment for electrically connecting the coaxial cable to the output portion.

In other exemplary embodiments, an antenna mount body for an antenna mount assembly includes a shielding compartment for housing a connection between an output contact and a coaxial cable. The shielding compartment has a length with a closed end and an open end opposite the closed end. The open end of the shielding compartment provides an opening to slidingly receive the coaxial cable and a coaxial cable connector into the shielding compartment. The antenna mount body also includes an output portion above the shielding compartment for connection to an antenna; a retaining hole transverse and intersecting the shielding compartment for receiving a locking pin to retain the coaxial cable and a coaxial cable connector in the compartment; and a shaft between the output portion and the shielding compartment for retaining a contact pin between the output portion and the compartment portion. The shaft transversely intersects the shielding compartment at a connection location. There is an access port to permit access to the shielding compartment at the connection location and configured to be closed by the coaxial cable connector when the coaxial cable and the coaxial cable connector are positioned in the shielding compartment for retention by the locking pin.

Connector assemblies for connecting a coaxial cable to an antenna mount assembly are disclosed. In exemplary embodiments, a connector assembly includes a compatibility adapter for attachment to the coaxial cable. The compatibility adapter has a length from a first end to a second end of the compatibility adapter. The compatibility adapter is configured to permit a dielectric core and a center conductor of the coaxial cable to pass from the first end to the second end through the compatibility adapter. The connector assembly also includes a tubular gate for mechanical attachment to the compatibility adapter and the antenna mount assembly. The tubular gate has an internal passage configured to substantially surround at least part of the compatibility adapter adjacent the second end of the compatibility adapter. The tubular gate is configured for sliding insertion into a compartment in the antenna mount assembly. The connector assembly also includes a crimp ferrule for substantially surrounding at least part of the compatibility adapter adjacent the first end and coupling a metal shield of the coaxial cable to the compatibility adapter.

Additional aspects provide methods relating to mounting and connecting antennas to transmission lines. In an exemplary embodiment, there is disclosed a method of installing an antenna mount including an antenna mount body with an output portion, a shielding compartment having an open end, an output contact extending between the output portion and the shielding compartment, and an access port for accessing the shielding compartment. In this example, the method includes mounting the antenna mount body to a mounting surface with the output portion extending through an opening in the mounting surface; coupling a connector assembly to a coaxial cable; inserting the coaxial cable and the connector assembly into the shielding compartment via the open end; connecting a center conductor of the coaxial cable to the output contact through the access port; and closing the access port to shield the connection between the center conductor and the output contact.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

DETAILED DESCRIPTION

Figure 1:
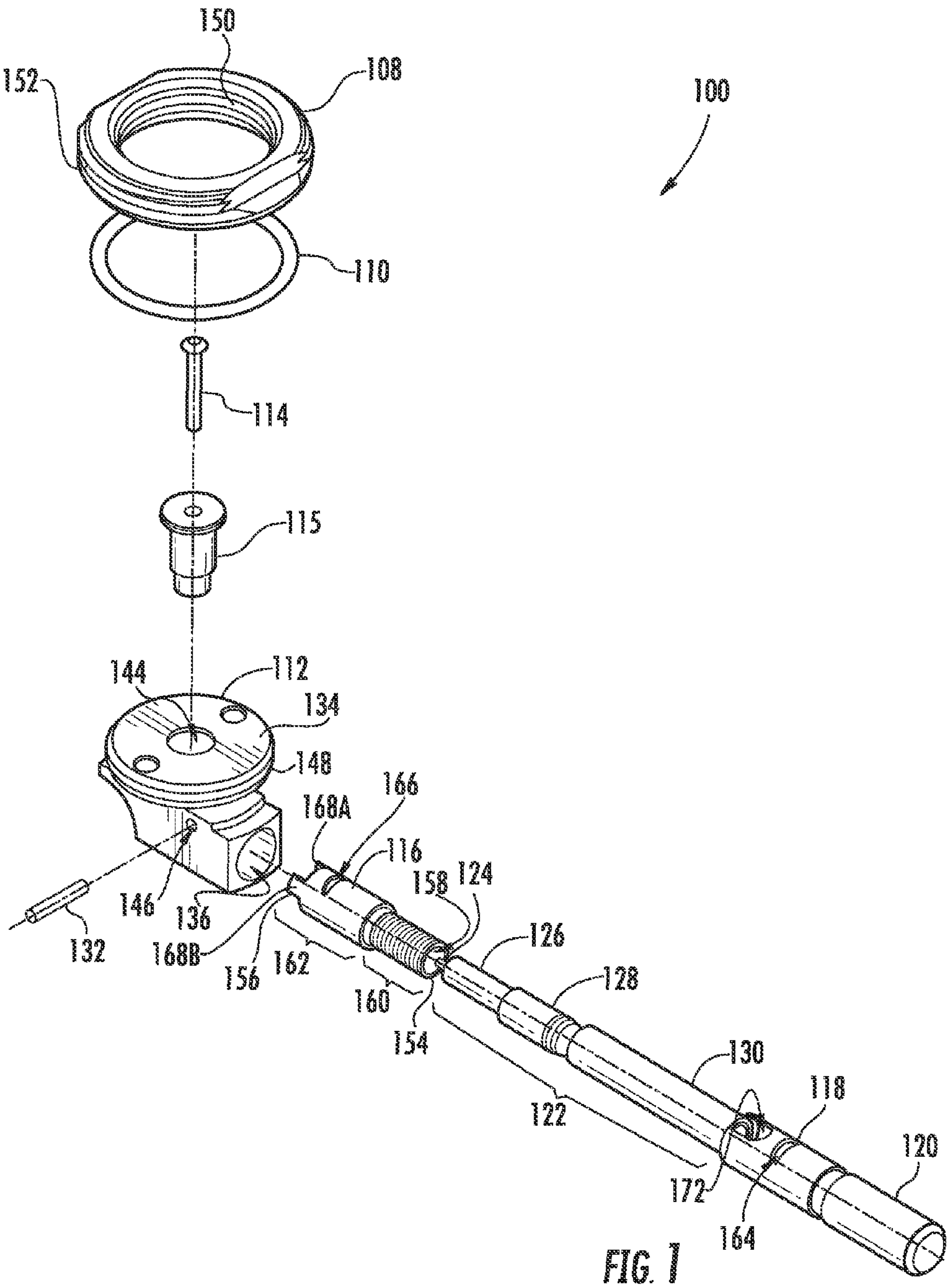
FIG. 1 is an exploded perspective view of an example antenna mount including one or more aspects of the present disclosure.

Example embodiments will now be described more fully with reference to the accompanying drawings.

As noted above, it is common to connect an antenna to a coaxial cable, which in turn, is connected to radio device, to allow radio frequency signals to be transmitted and/or received between the antenna and radio device. The inventors hereof have recognized that at least some existing antenna mount designs lack features to adequately address the demands associated with high frequency operation, such as the failure to provide adequate electromagnetic interference (EMI) and/or radio frequency interference (RFI) shielding. Due to the lack of adequate shielding, EMI/RFI interference may cause degradation or complete loss of important signals, thereby rendering the electronic equipment inefficient or inoperable. As used herein, the term “EMI” should be considered to generally include and refer to EMI emissions and RFI emissions, and the term “electromagnetic” should be considered to generally include and refer to electromagnetic and radio frequency from external sources and internal sources. Accordingly, the term shielding (as used herein) generally includes and refers to EMI shielding and RFI shielding, for example, to prevent (or at least reduce) ingress and egress of EMI and RFI relative to an enclosure in which electronic equipment is disposed.

The inventors have also recognized that at least some existing antenna mount designs lack features to adequately address manufacturability and mechanical compatibility with the broadening variance of mounting and coaxial cable configurations. For example, some existing antenna mount designs include components that must be machined and/or that can only be used with a single size/type of coaxial cable.

The inventors have disclosed herein exemplary embodiments of connectors, devices, or assemblies that may be used for mounting antennas to a support surface and for connecting the antennas to transmission lines (e.g., coaxial cables, etc.), and which may also conceal and shield the electrical connection joint as described herein.

In an exemplary embodiment, an antenna mount (e.g., 100, etc.) generally includes an output contact (e.g., 114, etc.), an antenna mount body (e.g., 112, etc.), and a coaxial feed portion (e.g., 104, etc.). The antenna mount body includes an output portion (e.g., 134, etc.), a shielding compartment (e.g., 136, etc.) for housing and electromagnetically shielding a connection between a coaxial cable and the output contact, and an access port (e.g., 142, etc.) to permit access to the shielding compartment around the connection between the coaxial cable and the output contact. The coaxial feed portion is configured to receive the coaxial cable coupled to a coaxial cable connector (e.g., 116, 118, 120, etc.). The antenna mount includes an antenna mount nut (e.g., 108, etc.) mechanically attachable to the output portion of the antenna mount body. The antenna mount nut is configured for mechanically attaching an antenna to the antenna mount body. The antenna mount includes the output contact (e.g., 114, etc.) coupled to the antenna mount body. The output contact extends from the output portion and into the shielding compartment for electrically connecting the coaxial cable to the output portion.

Exemplary embodiments of an antenna mount disclosed herein may be used with and are compatible with more than one size of transmission line (e.g., different coaxial cable sizes, etc.). Also, the metal chamber in disclosed exemplary embodiments, which provides the EMI/RF shielding, may be machined or cast, though casting may allow for easier manufacturability, lower costs, and/or more mechanically rugged designs.

The antenna mount may be configured differently (e.g., different sizes, shapes, materials, etc.) depending on the intended application. In one example embodiment, the antenna mount includes a RF shielding compartment defined or provided by a brass tubular chamber or cylindrical gate having a length of about ¾ inches and which provides RF or EMI shielding, for example, at high RF frequencies.

Figure 9:
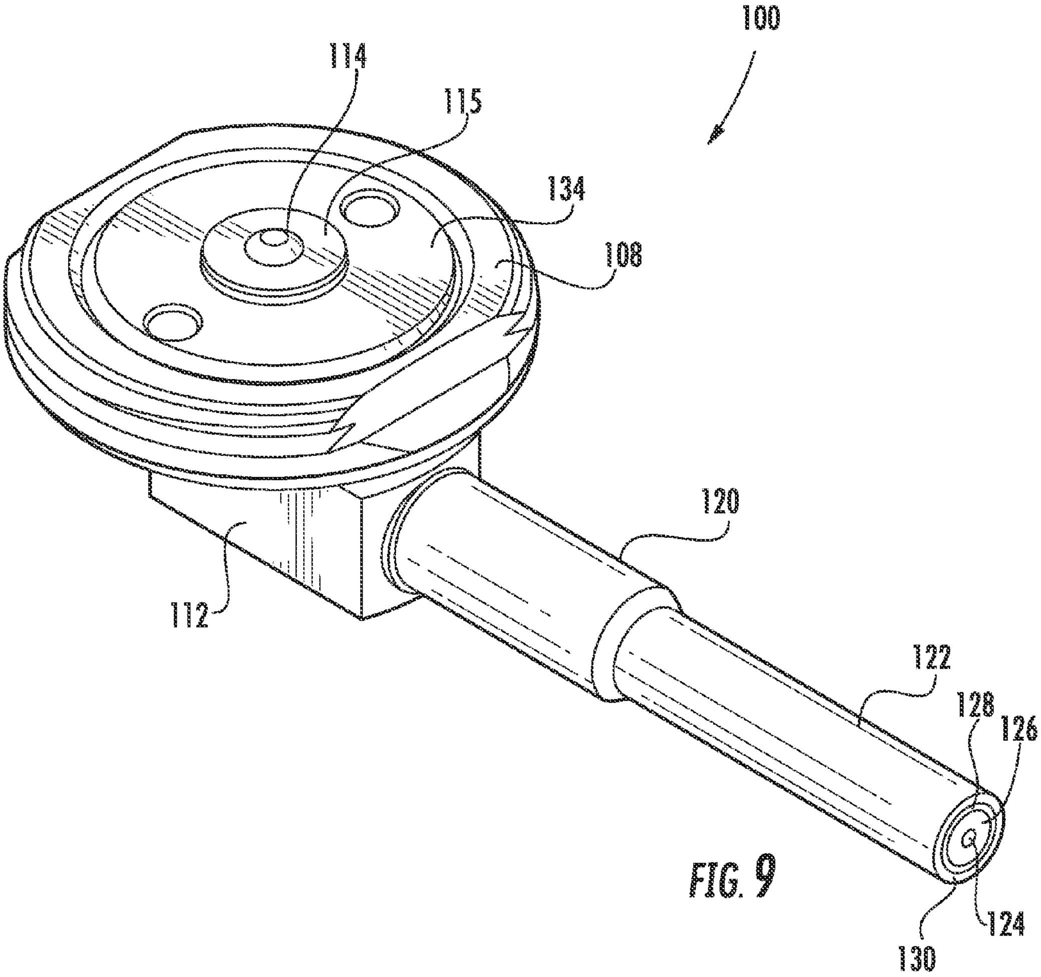
FIG. 9 is an upper perspective view of the antenna mount shown in FIG. 1 after being assembled.
Figure 10:
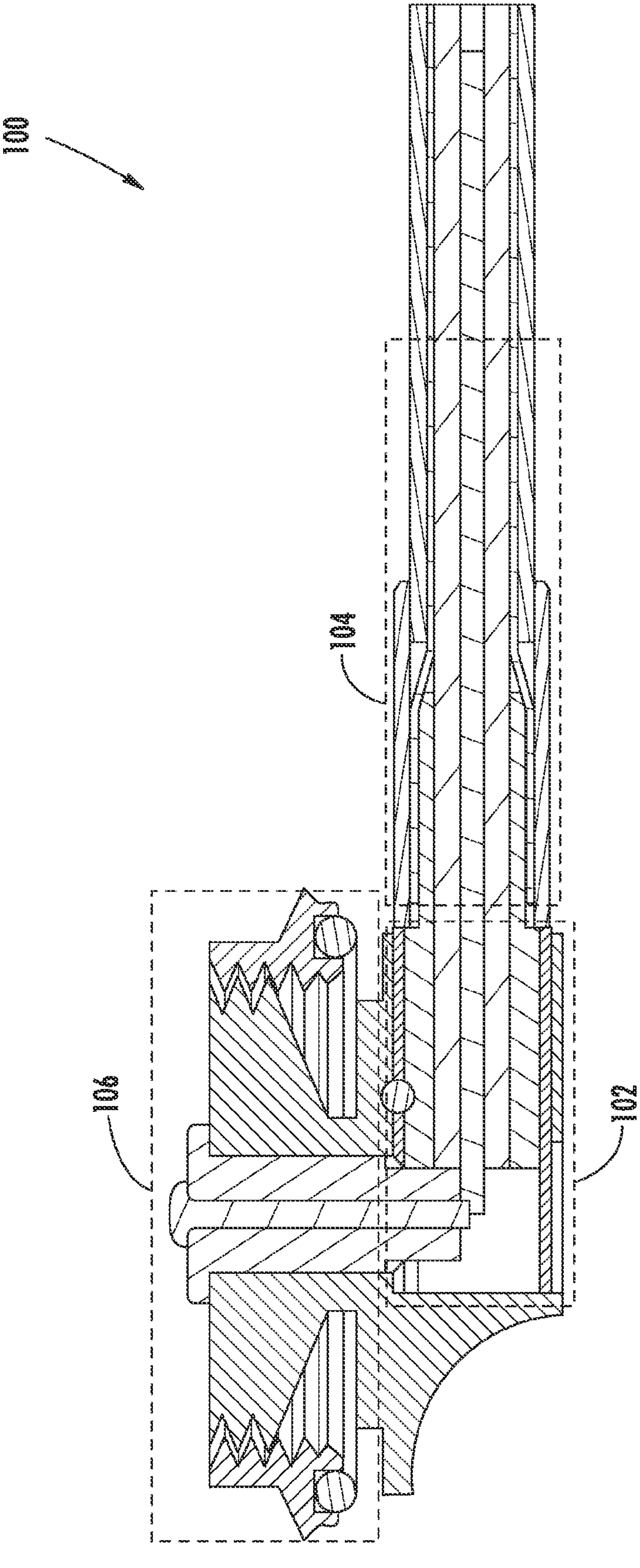
FIG. 10 is a cross-sectional side view of the antenna mount shown in FIG. 9.

With reference now to the drawings, FIGS. 1 through 17 illustrate an exemplary embodiment of an antenna mount 100 embodying one or more aspects of the present disclosure. As shown in FIG. 10, the assembled antenna mount 100 may be generally described as including three major portions, namely, a shielded joint compartment portion 102, a coaxial feed portion 104, and an antenna mount output port portion 106. The antenna mount output port portion 106 is an RF coaxial output port for connecting RF signals to an antenna (e.g., an NMO style mount). The coaxial feed portion 104 is a coaxial RF transmission line cable for connecting RF signals to the antenna mount output port portion 106. The connection between the output port portion 106 and the coaxial feed portion 104 is made in the shielded joint compartment portion 102. The three major portions of the antenna mount 100 (e.g., 102, 104, 106) are general descriptive classifications. As will be seen below, the antenna mount 100 comprises numerous parts that may be classified and grouped in various ways. For example, the output port portion 106 and part of the shielded joint compartment 102 may be constructed from a single part. Similarly, part of the shielded joint compartment 102 and part of the coaxial feed portion 104 may be considered a connector assembly.

FIG. 1 illustrates an exploded view of the antenna mount 100. The antenna mount 100 includes an antenna mount nut 108, a seal 110, and an antenna mount body 112. The antenna mount nut 108 is configured for attachment to the antenna mount body 112. The antenna mount 100 also includes an output contact pin 114 and insulator 115 for attachment to the antenna mount body 112. The antenna mount 100 includes a connector assembly including a compatibility adapter 116, a tubular gate 118 and a crimp ferrule 120. A coaxial cable 122 includes a center conductor 124, a dielectric core 126 around the center conductor 124, a metal shield 128 surrounding the dielectric core and a jacket 130 around the metal shield 128. The antenna mount 100 may also include retaining pin 132 (e.g., a spring lock pin, other elongate connector, etc.).

Figure 2:
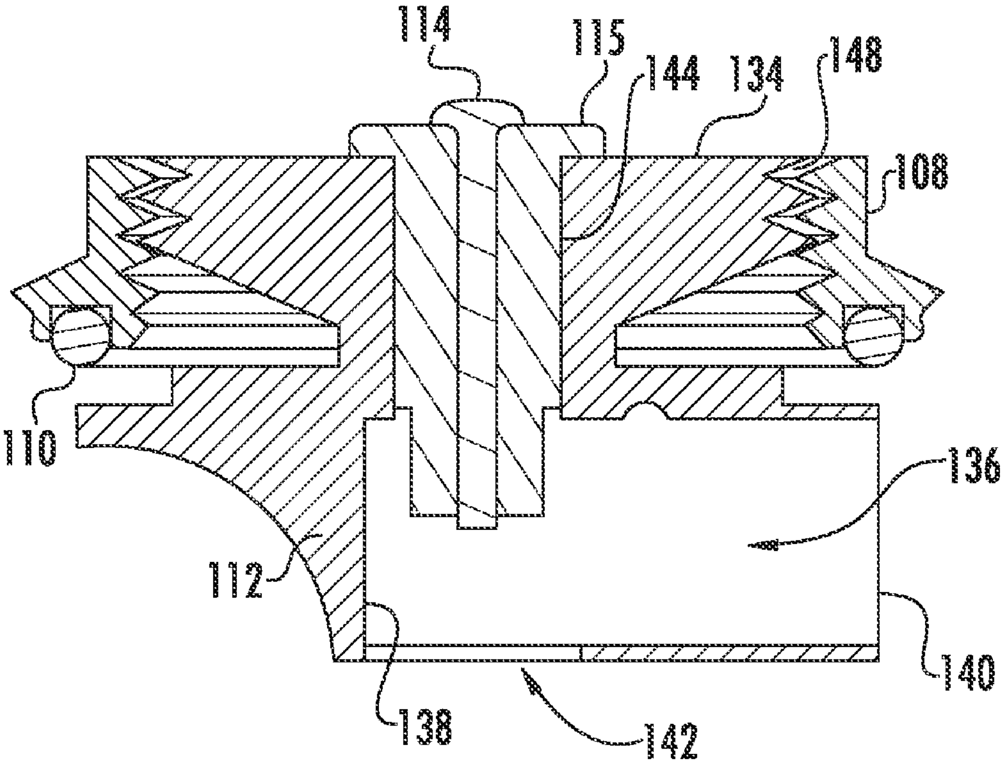
FIG. 2 is a cross-sectional side view of the antenna mount shown in FIG. 1 without the coaxial cable and connector assembly.
Figure 3:
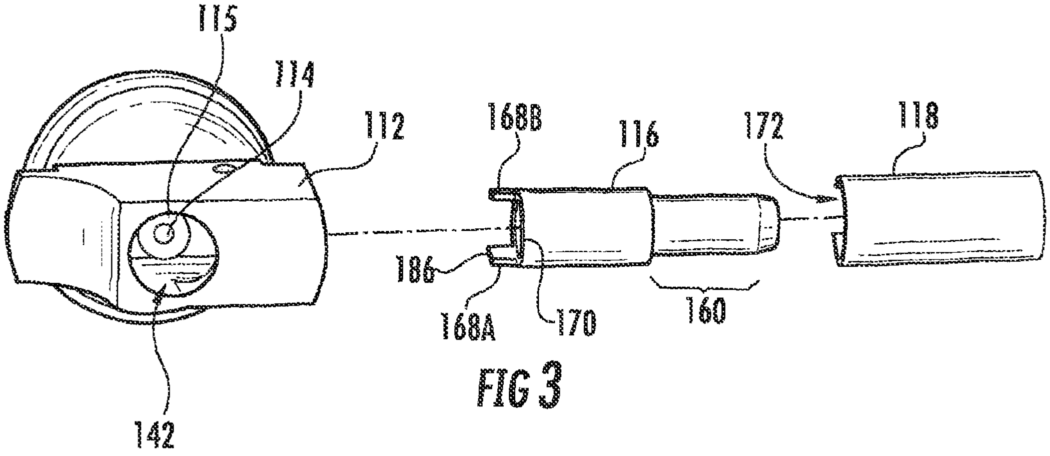
FIGS. 3-8 are bottom views of the antenna mount shown in FIG. 1 during different stages of assembly.

As may be best seen in FIG. 2, the antenna mount body 112 may include an output portion 134 and a shielding compartment 136. The output portion 134 is used for coupling RF signals between an antenna (e.g., antenna 178 (FIG. 12), etc.) attached to the antenna mount 100 and a coaxial cable 122. The shielding compartment 136 is a hollow chamber within the antenna mount body 112 to house and shield the connection between the center conductor 124 of the coaxial cable 122 and the output contact 114. The antenna mount body 112 may be constructed of any material suitable for EMI and/or RF shielding. In some embodiments the antenna mount body 112 comprises a metal. For example, the antenna mount body 112 may be made of brass, zinc, other metals, alloys, other electrically-conductive materials, etc. The antenna mount body 112 may be fabricated by any suitable means of fabrication, including, for example, machining, casting, a combination of machining and casting, etc.

The shielding compartment 136 includes a closed end 138 and an open end 140. The open end 140 is an input portion for receiving the coaxial cable 122, compatibility adapter 116, and tubular gate 118 into the shielding compartment 136. When the coaxial cable 122, compatibility adapter 116, and tubular gate 118 are within the shielding compartment 136, the open end 140 of the shielding compartment 136 is substantially closed by the coaxial cable 122, compatibility adapter 116, and tubular gate 118 (as best seen in FIGS. 9-12). An access port 142 permits access to the location in the shielding compartment 136 where the center conductor 124 and the output contact 114 are to be connected. As will be described in more detail below, this access port 142 permits access when the antenna mount 100 is being assembled, and is closed by sliding the tubular gate 118 into its final position (see, e.g., FIGS. 6-8 and 10-12).

The antenna mount body 112 includes a shaft 144 from the output portion 134 to the shielding compartment 136. The insulator 115 and the output contact 114 pass through this shaft 144 from the output portion 134 to the shielding compartment 136, where the output contact 114 may be connected to the center conductor 124 of the coaxial cable 122. The insulator 115 surrounds a portion of the output contact 114 to insulate the output contact 114 from the antenna mount body 112. The insulator 115 also operates as a support to hold the output contact 114 in its proper position relative to the antenna mount body 112. The insulator may be made of any suitable insulating material, including plastics, PTFE, etc. and the output contact 114 may be made of any suitable electrically conductive material, including, e.g., brass, copper, etc.

A retaining hole 146 extends through the antenna mount body 112 transverse and intersecting the length of the shielding compartment 136. In some embodiments, the retaining hole 146 passes completely through the antenna mount body 112, while in other embodiments the retaining hole 146 passes through only one side of the antenna mount body 112 and into the shielding compartment 136. The retaining hole 146 is configured to receive the retaining pin 132. As will be explained in more detail below, the retaining pin 132 is inserted into the retaining hole 146 to lock, retain, restrain, etc. the coaxial cable 122, compatibility adapter 116, and/or tubular gate 118 in an assembled position within the shielding compartment 136. The retaining pin 132 may be stainless steel or any other suitable material.

The antenna mount body 112 may include external threads 148 around the output portion 134 for mating with corresponding internal threads 150 on the antenna mount nut 108. The antenna mount nut 108 includes external threads 152 for mechanical connection to corresponding threads on an antenna, antenna assembly, etc. The threads 148, 150, 152 may be replaced with any other suitable connector. The antenna mount nut 108 may be made of any suitable material including, for example, a metal such as brass, zinc, other metals, alloys, other electrically-conductive materials, etc.

The tubular gate 118 is configured (e.g., sized, shaped, etc.) for sliding insertion into the shielding compartment 136 through the open end 140 of the shielding compartment 136. In the illustrated embodiment, the shielding compartment 136 and the tubular gate 118 both have a cylindrical shape. The outer diameter of the tubular gate 118 is about the same size as the diameter of the shielding compartment 136, allowing the tubular gate 118 to be slidingly inserted into the shielding compartment 136. The tubular gate 118 is also configured to overlap (e.g., surround, enclose, etc) a portion of the compatibility adapter 116. The tubular gate 118 is a hollow cylinder and, accordingly, has an inner diameter. The inner diameter of the tubular gate 118 is substantially the same size as an outer diameter of the compatibility adapter 116.

The illustrated compatibility adapter 116 has a hollow cylindrical shape having a first end 154 and a second end 156. An interior passage 158 traverses from the first end 154 to the second end 156. The interior passage 158 has a diameter of approximately the diameter of the dielectric core 126 to permit the dielectric core 126 (and the center conductor 124 within the dielectric core 126) to pass from the first end 154 to the second end 156 through the interior passage 158. The exterior of the compatibility adapter 116 generally includes two distinct sections, a threaded portion 160 adjacent the first end 154 and a coupling portion 162 adjacent the second end 156. The coupling portion 162 has an external diameter of approximately the same size as the inner diameter of the tubular gate 118. Thus, the compatibility adapter 116 may be inserted into, and through, the tubular gate 118. The threaded portion 160 includes threads for engaging the metal shield 128 of the coaxial cable 122. In some embodiments, the first end 154 of the compatibility adapter 116 is configured to flare the metal shield 128 away from the dielectric core 126 and direct it over the threaded portion 160 when the coaxial cable 122 is inserted into the compatibility adapter 116.

Different size coaxial cables may be accommodated in the antenna mount 100 by simply changing the diameter of the interior passage 158 of the compatibility adapter 116. No other changes to the antenna mount 100 may be needed, allowing the same antenna mount body 112, antenna mount nut 108, tubular gate 118, etc. to be used with numerous different sized coaxial cables. For example, if a smaller diameter coaxial cable than the illustrated coaxial cable 122 were to be used in the antenna mount 100, a compatibility adapter 116 with an interior passage 158 with a diameter about the same size as the dielectric core 126 of the smaller coaxial cable may be used. The external diameter of the coupling portion 162 of such a compatibility adapter 116 with a smaller diameter interior passage 158 is the same as the illustrated compatibility adapter 116. Accordingly, the smaller compatibility adapter 116 will still properly couple with the tubular gate 118 and, therefore, will still properly couple the smaller coaxial cable to the antenna mount body 112 and the antenna mount 100.

The crimp ferrule 120 is configured to overlap (e.g., surround, enclose, etc.) the threaded portion 160 of the compatibility adapter 116. In the illustrated embodiment, the crimp ferrule 120 has a hollow cylindrical shape with an internal diameter about the same as (but slightly larger than) the diameter of the threaded portion 160 of the compatibility adapter 116. When the antenna mount 100 is assembled, the crimp ferrule 120 is crimped around the metal shield 128 and the threaded portion 160 of the compatibility adapter 116. This couples the metal shield 128 to the threads of the compatibility adapter 116 to electrically couple the metal shield 128 to the compatibility adapter 116 (and through it to the tubular gate 118, the antenna mount body 112, etc.) and to mechanically couple the coaxial cable 122 to the compatibility adapter 116.

The tubular gate 118 and the compatibility adapter 116 each include an aperture 164, 166 (also sometimes referred to as slots, retaining slots, stops, locks, etc.) The apertures 164, 166 pass through a portion of the tubular gate 118 and the compatibility adapter 116 transverse to their respective lengths. The apertures 164, 166 are configured (e.g., positioned, sized, etc.) to align with each other when the tubular gate 118 and the compatibility adapter 116 are in their proper final positions relative to one another during assembly of the antenna mount 100. The apertures 164, 166 are further configured to align with the retaining hole 146 when the tubular gate 118 and the compatibility adapter 116 are in their final positions during assembly of the antenna mount 100. Thus, when assembled, the retaining hole 146 and the apertures 164, 166 are aligned so that the retaining pin 132 may be inserted through the retaining hole 146 and the apertures 164, 166 to retain the compatibility adapter 116, the tubular gate 118, and the coaxial cable in their assembled positions relative to the antenna mount body 112.

The second end 156 of the compatibility adapter 116 includes a first tab 168A and a second tab 168B opposite the first tab 168A (collectively, tabs 168). The tabs 168 extend from an edge 170 of the compatibility adapter 116. The tabs 168 assist in aligning the compatibility adapter 116 with the insulator 115 (and accordingly help align the center conductor 124 with the output contact 114) when the antenna mount 100 is assembled, without blocking access to the center conductor 124 and the output contact 114.

The tubular gate 118 includes a cutout 172. The cutout 172 is configured (e.g., sized, shaped, positioned, etc.) to encompass at least part of the insulator 115 when the antenna mount 100 is assembled. Without the cutout 172, the tubular gate 118 in this embodiment would contact the insulator 115 and be prevented from full insertion into the shielding compartment 136.

The compatibility adapter 116, the tubular gate 118, and the crimp ferrule 120 may be made of the same or different materials. The compatibility adapter 116, the tubular gate 118, and the crimp ferrule 120 may also be made of the same or different materials from the antenna mount body 112 or other components of the antenna mount 100. In some embodiments, the compatibility adapter 116, the tubular gate 118, and the crimp ferrule 120 are made of brass. Other suitable materials may also be used, such as zinc, other metals, alloys, other electrically-conductive materials, etc.

An exemplary process of assembling the antenna mount 100 will now be discussed with particular reference to FIGS. 3-9. For clarity, the coaxial cable is not illustrated in the FIGS. 3-9. Installation of the antenna mount 100 to a mounting surface will be discussed separately below with reference to FIGS. 12-14.

To assemble the antenna mount 100, a portion of the jacket 130 of the coaxial cable 122 is removed and a portion of the dielectric core 126 is removed to expose part of the center conductor 124 extending beyond the dielectric core 126 (both as illustrated in FIG. 1). The crimp ferrule 120 is positioned over the jacket 130 of the coaxial cable 122. The coaxial cable 122 is then coupled to the compatibility adapter 116 by sliding the dielectric core 126 through the interior passage 158 of the compatibility adapter 116. If the diameter of the interior passage 158 is the same as the outer diameter of the dielectric core 126, this action may flare (e.g., separate, expand, stretch, etc.) the metal shield 128 away from the dielectric core 126 and over the threaded portion 160 of the compatibility adapter 116. Alternatively, the metal shield 128 may be flared by the person assembling the antenna mount 100 (e.g., by hand, using a tool, etc.) The compatibility adapter 116 is positioned on the coaxial cable 122 so that the center conductor 124 extends to about an end 186 of the tabs 168. The insulator 115 and the output contact 114 are also inserted into the shaft 144 through the output portion 134. Alternatively, the antenna mount body 112 may be provided with the insulator 115 and the output contact 114 already installed in the shaft 144.

Figure 4:
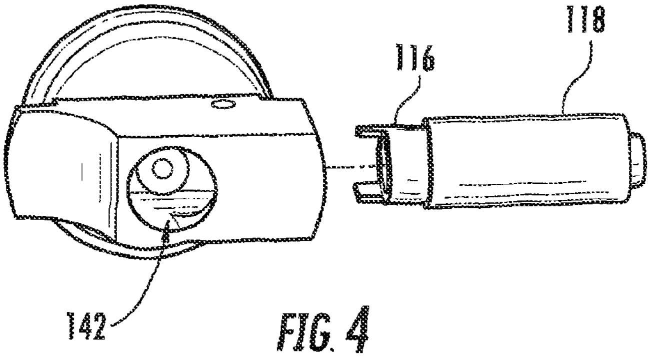
Figure 5:
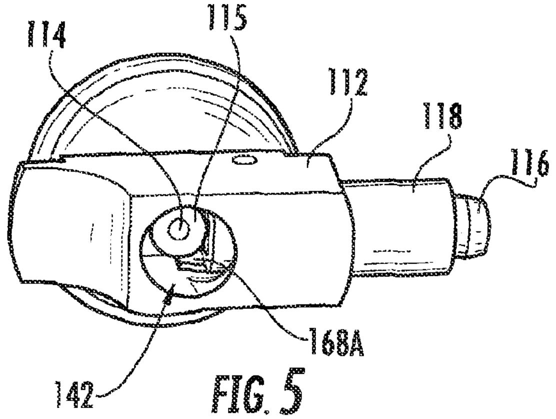

As shown in FIG. 4, the tubular gate 118 is positioned over part of the compatibility adapter 116. The tubular gate 118 is positioned so that it does not extend beyond the edge 170 of the compatibility adapter 116. The compatibility adapter 116, the tubular gate 118, and the coaxial cable 122 are inserted into the shielding compartment 136 (e.g., by sliding, etc.) through the open end 140 until positioned as shown in FIG. 5. At this position, the tabs 168 are positioned on opposite sides of the insulator 115 and the edge 170 is against the insulator 115. The dielectric core 126 may also contact the insulator 115. The compatibility adapter 116 is prevented by the insulator 115 contacting the edge 170 from being inserted further into the shielding compartment 136. In this position, the center conductor 124 of the coaxial cable 122, which extends to about the end 186 of the tabs 168, is aligned with part of the output contact 114 in the shielding compartment 136. The aperture 166 is also aligned with the retaining hole 146. The center conductor 124 and the output contact 114 may then be coupled to each other (e.g., soldered, welded, conductively glued, etc.) through the access port 142.

Figure 6:
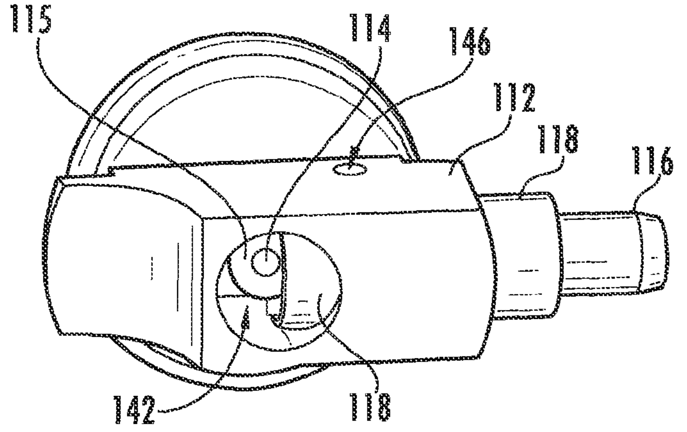
Figure 7:
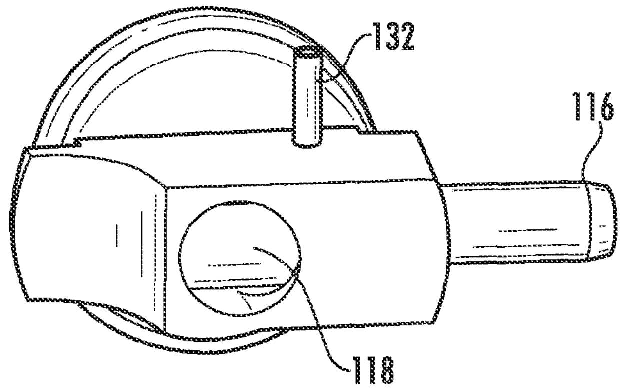
Figure 8:
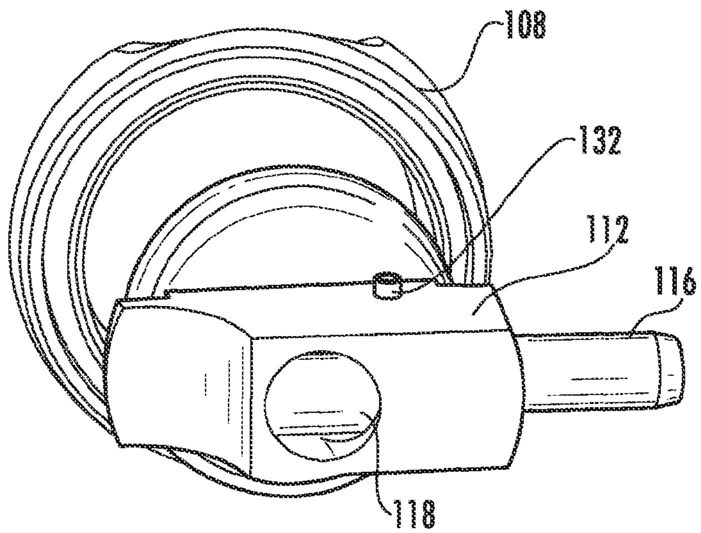

After the center conductor 124 and the output contact 114 are coupled, the access port 142 may be closed, to fully surround (and thereby provide an EMI/RF shield for) the joint between the center conductor 124 and the output contact 114. To close the access port 142, the tubular gate 118 is slid further into the shielding compartment 136. The cutout 172 allows the tubular gate 118 to be slid beyond the insulator 115 as shown in FIG. 6. The tubular gate 118 is pushed further into the shielding compartment 136 until reaching the position of FIG. 7, in which the access port 142 is fully closed and the aperture 164 is aligned with the aperture 166 and the retaining hole 146. The retaining pin 132 is inserted into the retaining hole 146 and through the apertures 164, 166 as shown in FIGS. 6 and 7. The retaining pin 132 prevents the tubular gate 118 and the compatibility adapter 116 from moving relative to the antenna mount body 112. Thus, the coaxial cable 122 remains connected to the antenna mount 100, the access port 142 remains closed, and the connection between the center conductor 124 and the output contact 114 is shielded and protected. The crimp ferrule 120 is also positioned over the threaded portion 160 of the compatibility adapter 116 and the metal shield 128 which overlies the threaded portion 160. The crimp ferrule 120 is crimped around the metal shield 128 and the threaded portion 160 to electrically couple the metal shield 128 to the compatibility adapter 116 and to mechanically couple the coaxial cable 122 to the compatibility adapter 116 (and through to the rest of the antenna mount 100). The crimp ferrule 120 may also prevent the tubular gate 118 from moving out of the shielding compartment 136 (for example, if the retaining pin 132 broke, was removed, etc.). FIG. 9 illustrates the fully assembled antenna mount 100 including the coaxial cable 122.

The connection between the center conductor 124 and the output contact 114 may be accessed after assembly by reversing the assembly process. Specifically, the retaining pin 132 is removed from the retaining hole 146 (e.g., by pushing it through the antenna mount body 112 and out of the opposite side of the antenna mount body 112), the crimp ferrule 120 is removed, and the tubular gate 118 is partially removed from the shielding compartment 136 to expose the connection between the center conductor 124 and the output contact 114 through the access port 142. This accessibility after assembly may be useful to allow an installer to check, repair, replace, etc. the connection between the center conductor 124 and the output contact 114.

An exmplary process for installing the antenna mount 100 to a mounting surface will be described with reference to FIGS. 11-14.

Figure 11:
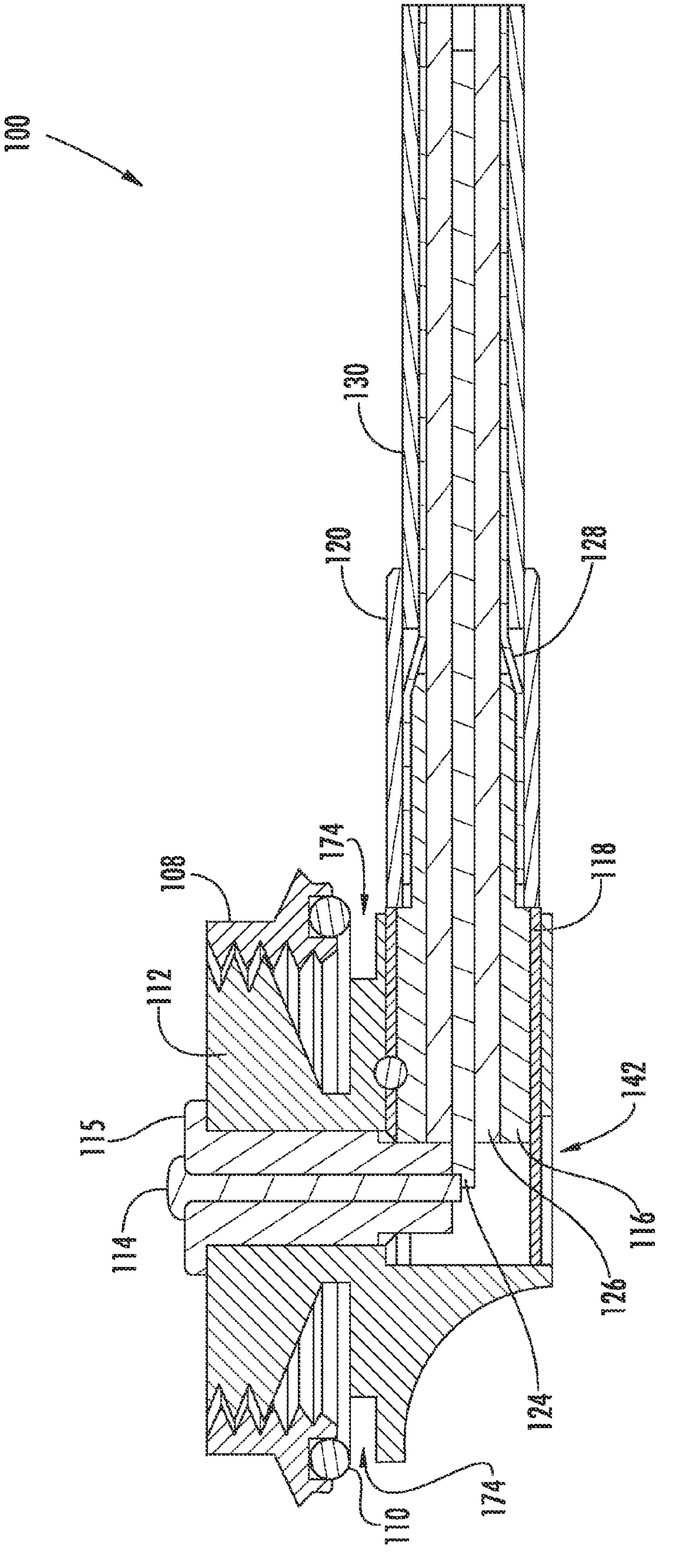
FIG. 11 is another cross-sectional side view of the antenna mount shown in FIG. 9.

When the antenna mount nut 108 is attached to the antenna mount body 112, the antenna mount body 112 and the antenna mount nut 108 cooperatively define a clamping area or gap 174 (best seen in FIG. 11). To install the antenna mount 100, the antenna mount body 112 (without the antenna mount nut 108) is inserted through a hole in a mounting surface 176 so that the output portion 134 is positioned adjacent, above, etc., a first side of the mounting surface 176 (e.g., the outside). The antenna mount nut 108 is attached to the antenna mount body 112 via the threads 148, 150 with the seal 110 positioned between the antenna mount nut 108 and the mounting surface 176. As the antenna mount nut 108 is tightened (e.g., by rotating the antenna mount nut 108 to decrease the size of the clamping area 174), the mounting surface 176 is clamped between the antenna mount nut 108 and the antenna mount body 112. The seal 110 is also held tightly between the antenna mount nut 108 and the mounting surface 176 to prevent debris, water, dust, etc. from passing between the two sides of the mounting surface 176 through the opening in which the antenna mount 100 is installed.

The mounting surface 176 may be any generally planar or contour surface. In some embodiments, the mounting surface 176 is a roof of a vehicle. The output portion 134 of the antenna mount 100 is positioned adjacent an exterior side of the roof and the shielding compartment 136 is positioned adjacent an interior side of the roof.

Figure 12:
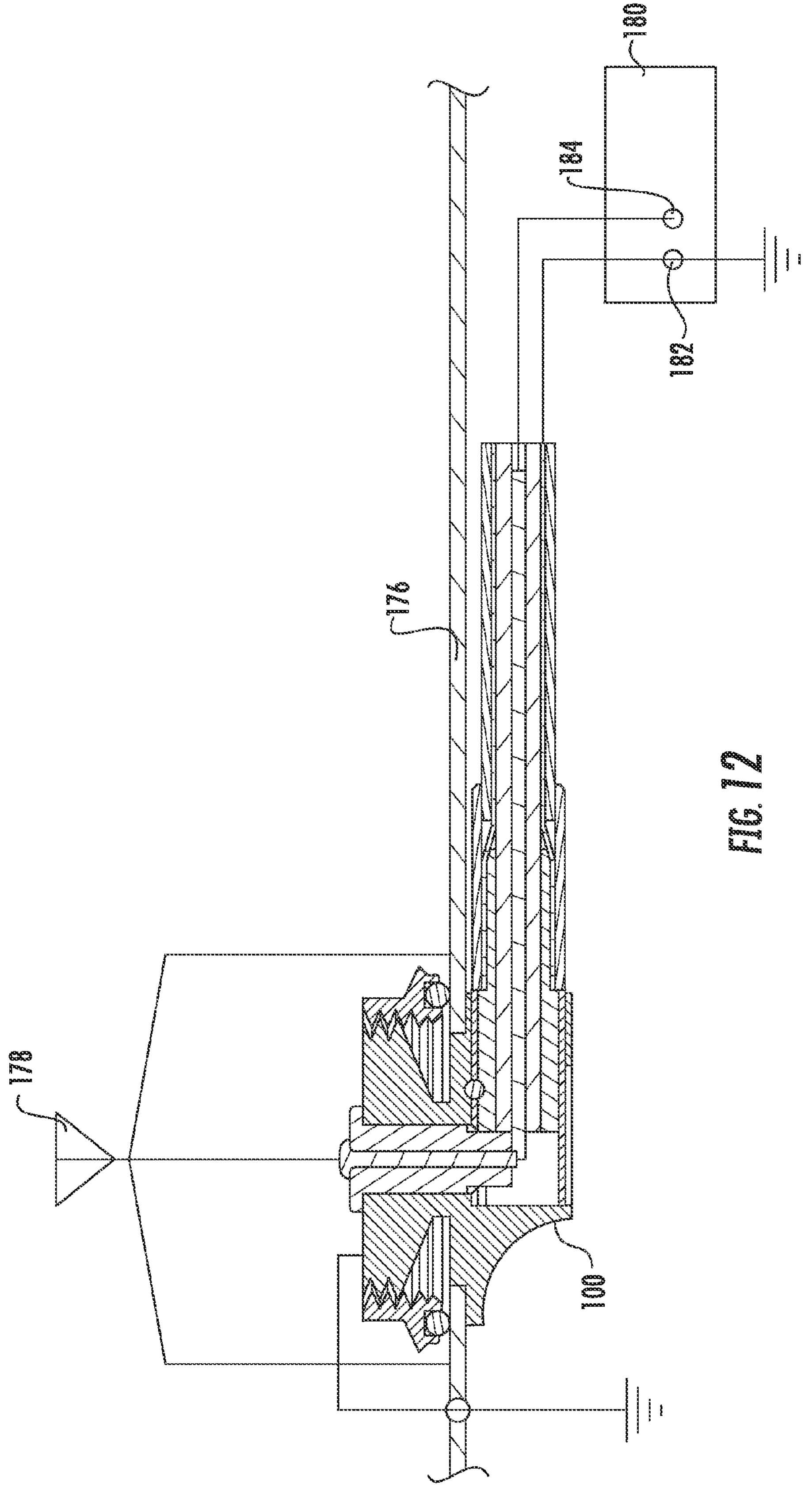
FIG. 12 is another cross-sectional side view of the antenna mount shown in FIG. 9, and is also illustrating an exemplary manner by which the connector assembly may interconnect an antenna to a coaxial cable connected to a radio device according to an exemplary embodiment.
Figure 13:
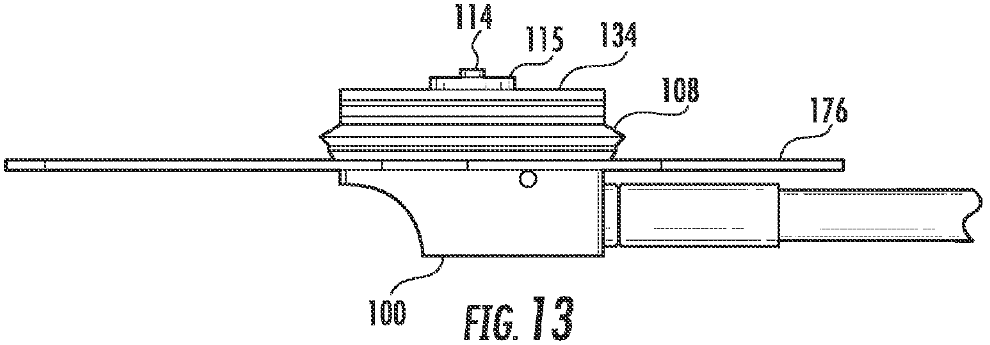
FIG. 13 is a side view illustrating the antenna mount shown in FIG. 9 mounted to a mounting surface.
Figure 14:
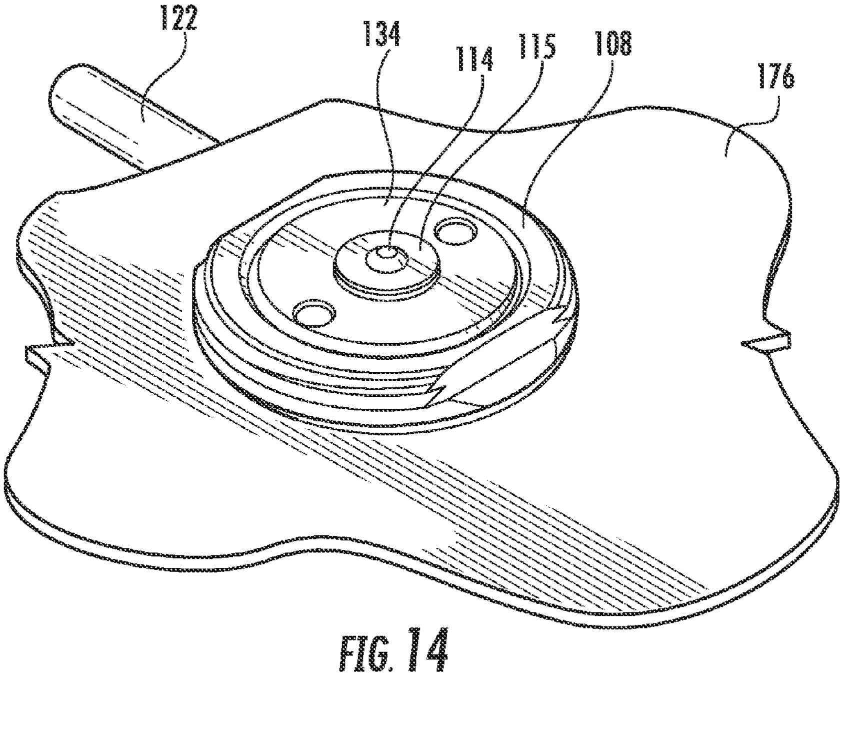
FIG. 14 is a perspective view of the antenna mount mounted to the mounting surface shown in FIG. 13.
Figure 15:
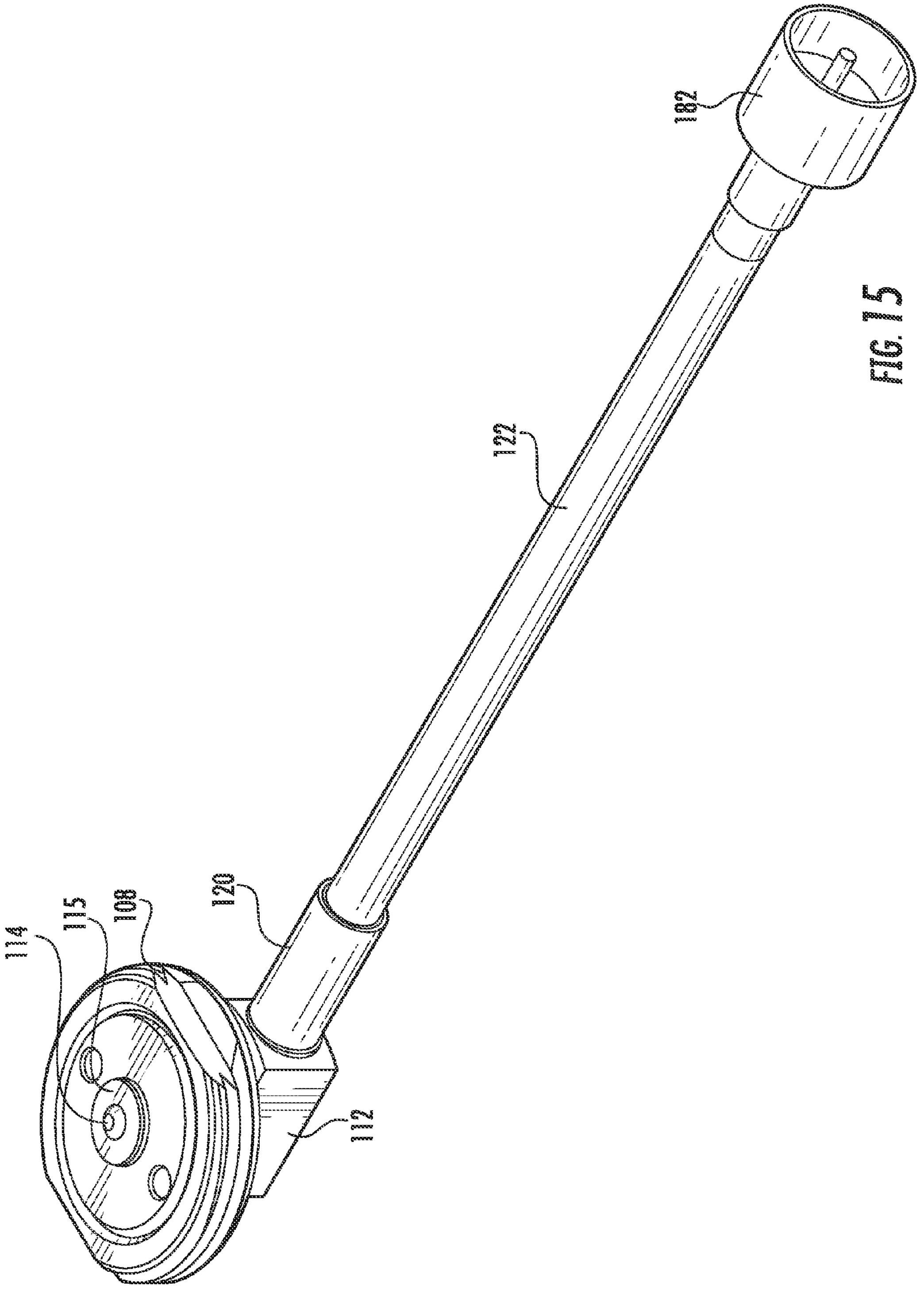
FIG. 15 is a perspective view of the of the antenna mount shown in FIG. 9, and is also illustrating an exemplary coaxial cable connected thereto.
Figure 16:
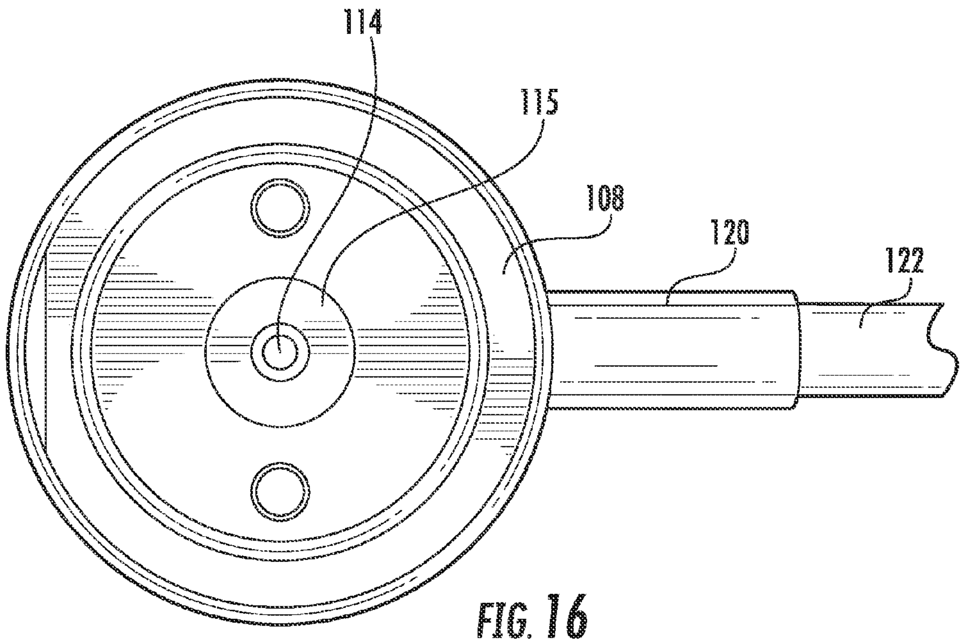
FIG. 16 is a top view of the antenna mount shown in FIG. 15.
Figure 17:
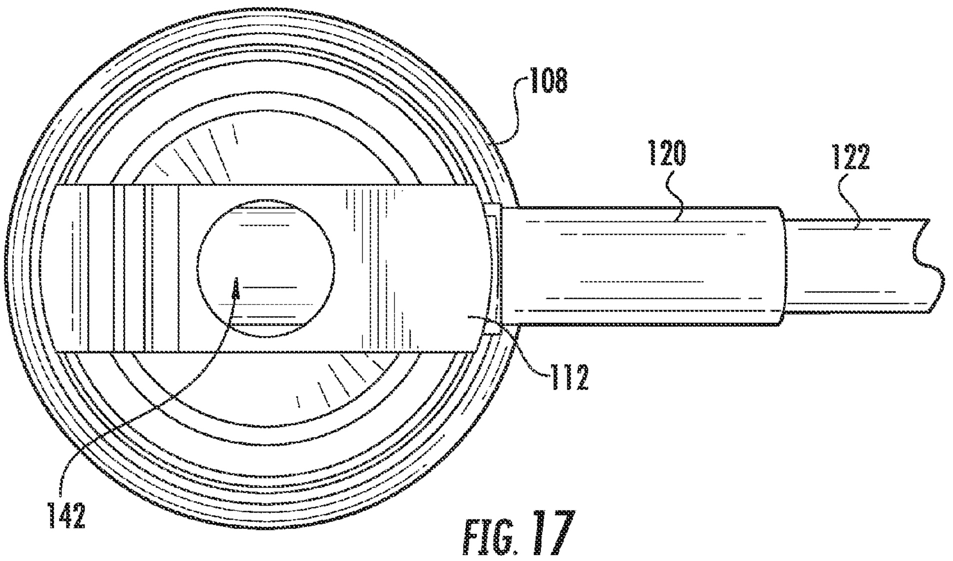
FIG. 17 is a bottom view of the antenna mount shown in FIG. 15.
Figure 18:
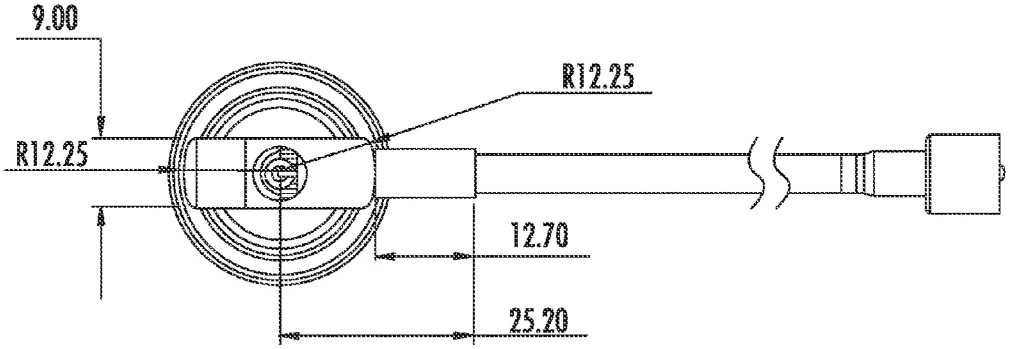
FIG. 18 is a bottom plan view of an example antenna mount including one or more aspects of the present disclosure connected to a coaxial cable.
Figure 19:
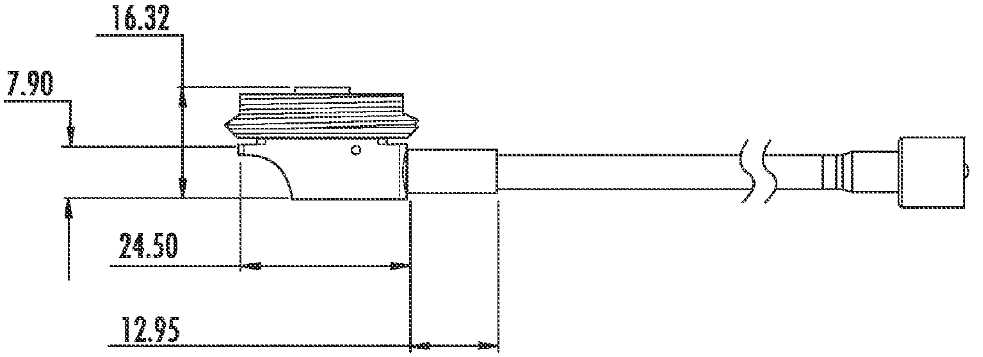
FIG. 19 is a side view of the example antenna mount of FIG. 18.
Figure 20:
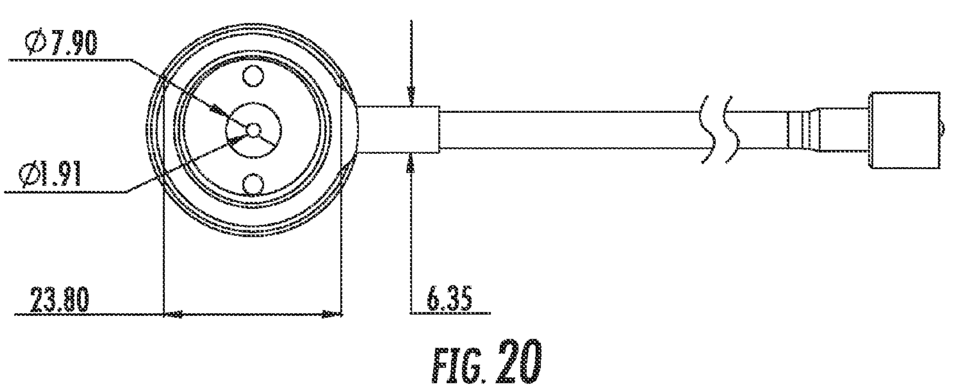
FIG. 20 is a top view of the example antenna mount of FIG. 18.
Figure 21:
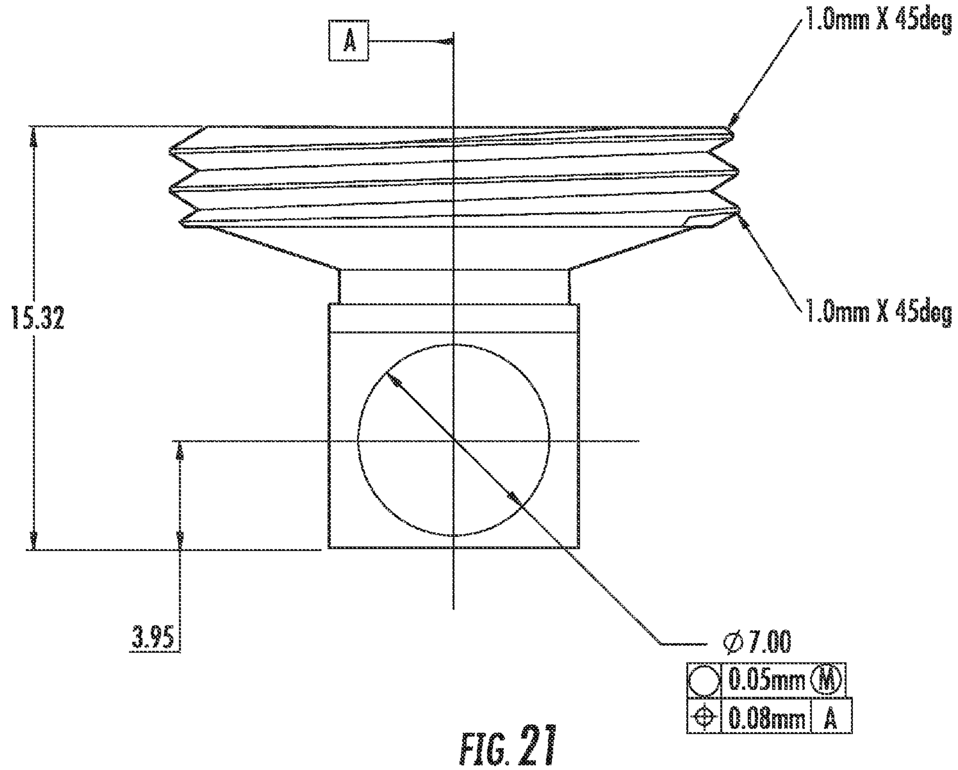
FIG. 21 is an end view of the example antenna mount of FIG. 18 with the coaxial cable removed.

FIG. 12 illustrates an exemplary manner by which the antenna mount 100 may interconnect an antenna 178 to the coaxial cable 122 connected to a radio device 180. The radio device 180 has a first connection 182 to ground and to the metal shield 128. The radio device 180 has second connection 184 to the center conductor 124 of the coaxial cable 122. The center conductor 124 connects to the output contact 114 (as described herein). The antenna 178 is electrically coupled to the output contact 114 to receive signals from the radio device 180. The antenna 178, the antenna mount body 112, and the mounting surface 176 are also connected to ground. The coaxial cable 122 may be connected to the radio device 180 by any suitable connectors (e.g., connector 182 in FIG. 15).

FIGS. 18-21 illustrate dimensions for an example antenna mount according to one or more aspects of the present disclosure. All dimensions are in millimeters unless otherwise indicated. It should be understood, however, that such dimensions are exemplary for illustration purposes only and are not intended to limit the scope of this disclosure to any particular dimensions.

Figure 22:
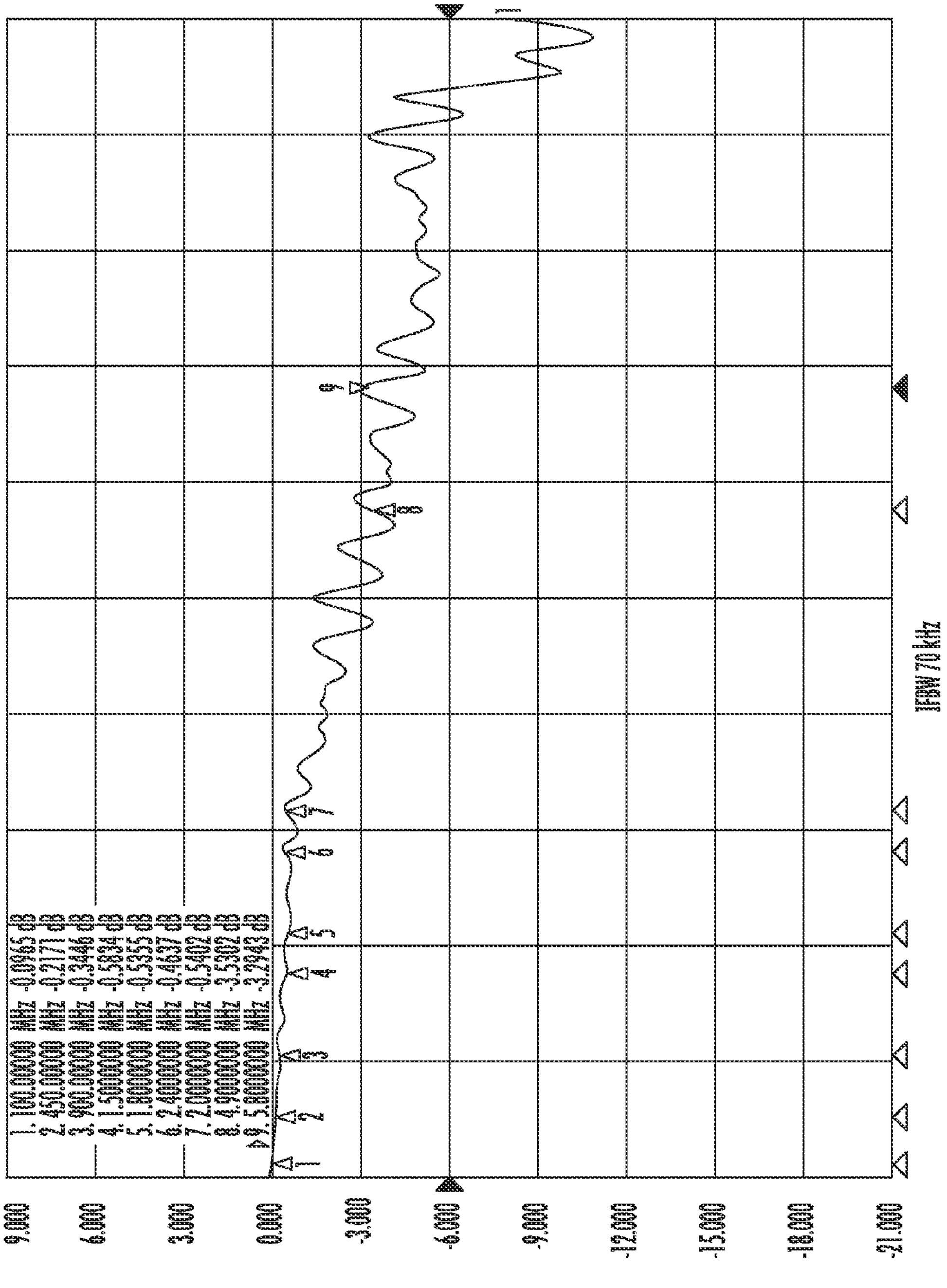
FIG. 22 is a line graph illustrating measured insertion loss in decibels for a prototype of the antenna mount shown in FIG. 9 over a frequency range of 100 megahertz to 8500 megahertz.

FIG. 22 illustrates analysis results measured for a prototype of the antenna mount 100 shown in FIGS. 1 through 17 constructed according to the dimensions in FIGS. 18-21. More specifically, FIG. 22 is a line graph illustrating measured insertion loss in decibels for the prototype of the antenna mount 100 over a frequency range of 100 megahertz to 8500 megahertz. These results shown in FIG. 22 are provided only for purposes of illustration and not for purposes of limitation. Generally, these analysis results show that the antenna mount 100 is operable such that the insertion loss from 100 megahertz to 3000 megahertz is 0.5 decibels and from 4900 megahertz to 5800 megahertz is 3 decibels. FIG. 22 also helps illustrate a possible improvement in electrical performance that may be realized by using the inventors' unique metal chamber (e.g., shielding compartment 136, tubular gate 118, etc.) to enclose an electrical connection (e.g., solder joint as shown in FIG. 11, etc.) that forms the radio frequency (RF) signal pathway between a transmission line (e.g., coaxial cable 122 etc.) and a mount contact pin (e.g., output contact 114, etc.), which metal chamber thus isolates or inhibits the RF energy from radiating outwardly from the electrical connection to the environment and/or isolates or inhibits RF signals from radiating into the antenna system. This RF isolation provided by the metal chamber may thus help maximize or at least increase the signal efficiency, for example, at frequencies of 100 megahertz to 5800 megahertz, or other suitable frequency ranges. The connection joint is also effectively EMI shielded to within the 6 gigahertz boundary.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the term "and/or" includes any and all combinations of one or more of the associated listed items. Also as used herein, the singular forms "a", "an" and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on", "engaged to", "connected to" or "coupled to" another element or layer, it may be directly on, engaged, connected or coupled to the other element or layer, or intervening elements or layers may be present. In contrast, when an element is referred to as being "directly on," "directly engaged to", "directly connected to" or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms, "next," etc., when used herein, do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath", "below", "lower", "above", "upper" and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The disclosure herein of particular values and particular ranges of values for given parameters are not exclusive of other values and ranges of values that may be useful in one or more of the examples disclosed herein. Moreover, it is envisioned that any two particular values for a specific parameter stated herein may define the endpoints of a range of values that may be suitable for the given parameter. The disclosure of a first value and a second value for a given parameter can be interpreted as disclosing that any value between the first and second values could also be employed for the given parameter. Similarly, it is envisioned that disclosure of two or more ranges of values for a parameter (whether such ranges are nested, overlapping or distinct) subsume all possible combination of ranges for the value that might be claimed using endpoints of the disclosed ranges.

Specific dimensions included in the drawings and/or disclosed herein are exemplary in nature and do not limit the scope of the present disclosure.

The foregoing description of the embodiments has been provided for purposes of illustration and description. It is not intended to be exhaustive or to limit the invention. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the invention, and all such modifications are intended to be included within the scope of the invention.

What is claimed is:

1. A connector assembly for connecting a coaxial cable to an antenna mount assembly, the connector assembly comprising:

a compatibility adapter for attachment to the coaxial cable, the compatibility adapter having a length from a first end to a second end of the compatibility adapter, the compatibility adapter configured to permit a dielectric core and a center conductor of the coaxial cable to pass from the first end to the second end through the compatibility adapter;

a tubular gate for mechanical attachment to the compatibility adapter and the antenna mount assembly, the tubular gate having an internal passage configured to substantially surround at least part of the compatibility adapter adjacent the second end of the compatibility adapter, the tubular gate configured for sliding insertion into a compartment in the antenna mount assembly; and a crimp ferrule for substantially surrounding at least part of the compatibility adapter adjacent the first end and coupling a metal shield of the coaxial cable to the compatibility adapter.

2. The connector assembly of claim 1 wherein:

the compatibility adapter includes a first aperture substantially perpendicular the length of the compatibility adapter; and the tubular gate includes a second aperture arranged for alignment with the first aperture to permit an elongate connector to pass through the first and second apertures to mechanically couple the tubular gate to the compatibility adapter.

3. The connector assembly of claim 2 wherein the first and second apertures are further configured for alignment with a third aperture in the antenna mount assembly to permit the elongate connector to pass through the first, second, and third apertures to mechanically couple the tubular gate, the compatibility adapter, and the antenna mount assembly.

4. The connector assembly of claim 1 wherein the compatibility adapter includes an internal passage having a diameter that is about the same as an outer diameter of the dielectric core of the coaxial cable to permit the dielectric core and the center conductor to pass from the first end to the second end through the compatibility adapter.

5. The connector assembly of claim 1 wherein the compatibility adapter includes a threaded portion adjacent the first end for mechanical coupling with the metal shield of the coaxial cable and the crimp ferrule.

6. The connector assembly of claim 5 wherein the compatibility adapter includes a coupling portion adjacent the second end, the coupling portion configured to fit within the internal passage of the tubular gate.

7. The connector assembly of claim 1 wherein the second end of the compatibility adapter includes first and second tabs on the compatibility adapter.

8. The connector assembly of claim 7 wherein the tubular gate is configured to cover an opening between the first and second tabs to prevent access through the compatibility adapter when the tubular gate is mechanically coupled to the compatibility adapter.

9. An antenna mount body for an antenna mount assembly, the antenna mount body comprising:

a shielding compartment for housing a connection between an output contact and a coaxial cable, the shielding compartment having a length with a closed end and an open end opposite the closed end, the open end of the shielding compartment providing an opening to slidingly receive the coaxial cable and a coaxial cable connector into the shielding compartment;

an output portion above the shielding compartment for connection to an antenna;

a retaining hole transverse and intersecting the shielding compartment for receiving a locking pin to retain the coaxial cable and a coaxial cable connector in the compartment;

a shaft between the output portion and the shielding compartment for retaining a contact pin between the output portion and the compartment portion, the shaft transversely intersecting the shielding compartment at a connection location; and an access port to permit access to the shielding compartment at the connection location and configured to be closed by the coaxial cable connector when the coaxial cable and the coaxial cable connector are positioned in the shielding compartment for retention by the locking pin.

10. The antenna mount body of claim 9 wherein the antenna mount body is monolithically constructed by machining or casting.

11. The antenna mount body of claim 10 wherein antenna mount body comprises a metal, brass, or zinc.

12. The antenna mount body of claim 9 wherein the output portion includes a threaded connector for mechanical attachment of an antenna mount nut.

13. The antenna mount body of claim 12 wherein the output portion is configured to electrically connect the contact pin to an antenna when the antenna is mechanically connected to the antenna mount body via the antenna mount nut.

14. An antenna mount assembly comprising the antenna mount body of claim 13 and an antenna mount nut including threads for mating engagement with the threaded connector of the output portion.

15. The antenna mount assembly of claim 14 wherein the antenna mount nut is configured for mechanical attachment of the antenna mount assembly to a generally planar surface and mechanical attachment of the antenna to the antenna mount assembly.

16. An antenna mount assembly comprising:

an output contact;

an antenna mount body including:

a shielding compartment for housing and electromagnetically shielding a connection between a coaxial cable and the output contact; and an access port to permit access to the shielding compartment around the connection between the coaxial cable and the output contact; and an output portion for coupling radio frequency signals between the coaxial cable and an antenna when attached to the antenna mount assembly;

an antenna mount nut mechanically attachable to the output portion of the antenna mount body, the antenna mount nut configured for mechanically attaching an antenna to the antenna mount body;

a coaxial feed portion configured to receive the coaxial cable coupled to a coaxial cable connector;

the output contact coupled to the antenna mount body and extending from the output portion and into the shielding compartment for electrically connecting the coaxial cable to the output portion.

17. The antenna mount assembly of claim 16 further comprising an insulator coupled to the antenna mount body and extending between the output portion and the shielding compartment, the insulator surrounding at least part of the output contact to electrically insulate the output contact from the antenna mount body.

18. The antenna mount assembly of claim 16 wherein the antenna mount nut and the antenna mount body cooperatively define a clamping area for attaching the assembly to a mounting surface to which the assembly is to be mounted by clamping a portion of the mounting surface in the clamping area with the antenna mount body and the antenna mount nut.

19. The antenna mount assembly of claim 18 further comprising a mechanical seal adjacent the antenna mount nut in the clamping area.

20. The antenna mount assembly of claim 16 further comprising a releasable retainer for releasably retaining the coaxial cable in the shielding compartment and releasably retaining the coaxial cable connector in a position closing the access port of the shielding compartment.

21. An antenna mount comprising the antenna mount assembly of claim 20 mounted to a mounting surface and a coaxial cable connector coupled to a coaxial cable, wherein:

the output portion of the antenna mount body is positioned adjacent a first side of the mounting surface;

the shielding compartment is adjacent a second side of the mounting surface;

at least part of the coaxial cable and the coaxial cable connector are positioned in the shielding compartment and retained therein by the releasable retainer;

a center conductor of the coaxial cable is electrically coupled to the output contact in the shielding compartment; and the coaxial cable connector is closing the access port.

22. The antenna mount assembly of claim 16 wherein the antenna mount assembly provides a minimum gain loss for RF signals of about −3 decibels for frequencies of up to about six gigahertz.

23. A method of installing an antenna mount, the antenna mount including an antenna mount body with an output portion, a shielding compartment having an open end, an output contact extending between the output portion and the shielding compartment, and an access port for accessing the shielding compartment, the method comprising:

mounting the antenna mount body to a mounting surface with the output portion extending through an opening in the mounting surface;

coupling a connector assembly to a coaxial cable;

inserting the coaxial cable and the connector assembly into the shielding compartment via the open end;

connecting a center conductor of the coaxial cable to the output contact through the access port; and closing the access port to shield the connection between the center conductor and the output contact.

24. The method of claim 23 wherein:

the connector assembly comprises a compatibility adapter; and the method further comprises selecting a compatibility adapter having an internal passage with a diameter approximately the same as an outer diameter of a dielectric core surrounding the center conductor of the coaxial cable.

25. The method of claim 24 wherein coupling the connector assembly to the coaxial cable includes attaching the compatibility adapter to the coaxial cable with the dielectric core positioned in the internal passage of the compatibility adapter, a portion of the center conductor of the coaxial cable extending beyond the dielectric core, and a portion of a metal shield of the coaxial cable surrounding a portion of an external surface of the compatibility adapter.

26. The method of claim 25 wherein coupling the connector assembly to the coaxial cable includes positioning a tubular gate around the compatibility adapter with the center conductor of the coaxial cable exposed, the tubular gate configured for sliding movement relative to the compatibility adapter and having an external size for sliding insertion into the shielding compartment via the open end of the shielding compartment.

27. The method of claim 26 wherein closing the access port includes sliding the tubular gate farther into the shielding compartment to close the access port with a portion of the tubular gate.

28. The method of claim 27 further comprising inserting a locking pin through the antenna mount body, the locking pin intersecting at least part of the tubular gate and the compatibility adapter to retain the coaxial cable, the tubular gate, and the compatibility adapter in their positions relative to the antenna mount body.

29. The method of claim 28 further comprising attaching a crimping ferrule around at least part of the portion of the metal shield of the coaxial cable surrounding the external surface of the compatibility adapter to couple the metal shield to the compatibility adapter.

* * * * *